United States Patent
Nie

(10) Patent No.: US 10,032,838 B2
(45) Date of Patent: Jul. 24, 2018

(54) AMOLED PIXEL DRIVING CIRCUIT AND PIXEL DRIVING METHOD

(71) Applicant: Shenzhen China Star Optoelectronics Technology Co., Ltd., Shenzhen (CN)

(72) Inventor: Chenglei Nie, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 283 days.

(21) Appl. No.: 15/106,836

(22) PCT Filed: May 13, 2016

(86) PCT No.: PCT/CN2016/082124
§ 371 (c)(1),
(2) Date: Jun. 21, 2016

(87) PCT Pub. No.: WO2017/177500
PCT Pub. Date: Oct. 19, 2017

(65) Prior Publication Data
US 2018/0102397 A1 Apr. 12, 2018

(30) Foreign Application Priority Data
Apr. 12, 2016 (CN) .......... 2016 1 0225696

(51) Int. Cl.
*H01L 27/32* (2006.01)
*G09G 3/3266* (2016.01)
*G09G 3/3258* (2016.01)

(52) U.S. Cl.
CPC ....... *H01L 27/3248* (2013.01); *G09G 3/3258* (2013.01); *G09G 3/3266* (2013.01); *H01L 27/3262* (2013.01); *H01L 27/3265* (2013.01)

(58) Field of Classification Search
CPC combination set(s) only.
See application file for complete search history.

*Primary Examiner* — Robin Mishler
(74) *Attorney, Agent, or Firm* — Leong C. Lei

(57) ABSTRACT

The present invention provides an AMOLED pixel driving circuit and a pixel driving method. By utilizing the dual gate thin film transistor to be the drive thin film transistor, in the pre-charge stage, the preset voltage ($V_{pre}$) is written to the bottom gate (BG) of the first thin film transistor (T1), and the power source voltage (VDD) is written to the top gate; in the threshold voltage programming stage, the voltage of the top gate (TG) of the first thin film transistor (T1) drops, and the threshold voltage is raised until the threshold voltage is lifted up to $Vth=V_{pre}-V_{OLED}$; in the drive stage, the voltage of the top gate (TG) is kept unchanged to keep the threshold voltage remaining to be $Vth=V_{pre}-V_{OLED}$, and the data signal Data drives the first thin film transistor (T1) to be activated to make the organic light emitting diode (D1) emit light.

12 Claims, 7 Drawing Sheets

AMOLED PIXEL DRIVING CIRCUIT AND PIXEL DRIVING METHOD

FIELD OF THE INVENTION

The present invention relates to a display technology field, and more particularly to an AMOLED pixel driving circuit and a pixel driving method.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device. The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. In the general AMOLED pixel driving circuit, there are two thin film transistors and one capacitor, which is named the 2T1C pixel circuit. The first thin film transistor is named to be the switch thin film transistor, and employed to control the entrance of the data signal. The second thin film transistor is named to be the drive thin film transistor, and employed to control the current flowing through the organic light emitting diode. Thus, the importance of the threshold voltage Vth of the drive thin film transistor is quite obvious. Either of the positive or negative drift of the Vth will make different current flow through the organic light emitting diode with the same data signal.

All the thin film transistors manufactured according to prior art will have the phenomenon of the threshold voltage drift. Meanwhile, the threshold voltage drift also will happen after the organic light emitting diode is used in a long time, which leads to that the current passing through the organic light emitting diode is not consistent with the desired current, and the panel brightness cannot satisfy the requirement.

The drift of the threshold voltage in the general 2T1C circuit cannot be improved with adjustment. Thus, it is required to add a new thin film transistor or a new signal to weaken the influence due to the threshold voltage drift so that the AMOLED pixel driving circuit can have the compensation function. At present, most of the AMOLED pixel driving circuit, in which the traditional single gate thin film transistor is employed to be the drive thin film transistor adjusts the value of the data signal which is required to input by detecting the threshold voltage of the thin film transistor and then according to the drift level of the threshold voltage. However, after the single gate thin film transistor suffers the stresses of the voltage and the light irradiation, the threshold voltage commonly drifts forward and increases, and thus the data signal has to be increased accordingly to weaken the influence of the threshold voltage drift of the drive thin film transistor. The increase of the data signal enlarges the voltage stress of the drive thin film transistor in advance to speed up the threshold voltage drift of the drive thin film transistor and to form the vicious cycle.

Certainly, some AMOLED pixel driving circuits having the compensation function utilizes the dual gate thin film transistor to be the drive thin film transistor. The property of the dual gate thin film transistor is that the influence of the voltage and the light irradiation stress to the threshold voltage is smaller, and meanwhile, the threshold voltage and the top gate voltages appear to have the negative correlation trend. As shown in FIG. 1, which shows an AMOLED pixel driving circuit according to prior art, the AMOLED pixel driving circuit has the 4T2C structure, i.e. the structure of four thin film transistors plus two capacitors, comprising: a first thin film transistor T10, a second thin film transistor T20, a third thin film transistor T30, a fourth thin film transistor T40, a first capacitor C10, a second capacitor C20 and an organic light emitting diode D10. The first thin film transistor T10 employed to be the drive thin film transistor is a dual gate thin film transistor, and a top gate thereof is electrically coupled to a third node T', and a bottom gate is electrically coupled to a first node B', and a source is electrically coupled to an anode of the organic light emitting diode D10, and a drain is electrically coupled to a second node D'; a gate of the third thin film transistor T30 receives a second scan control signal S20, and a source receive a power source voltage VDD, and a drain is electrically coupled to the second node D; a gate of the fourth thin film transistor T40 receives a third scan control signal S30, and a source receives a data signal Data, and a drain is electrically coupled to the first node B'; one end of the first capacitor C10 is coupled to the first node B', and the other end is grounded; one end of the second capacitor C20 is coupled to the third node T', and the other end is grounded, and an anode of the organic light emitting diode D10 is coupled to the source of the first thin film transistor T10, and a cathode is grounded.

FIG. 2 is a sequence diagram corresponding to the circuit shown in FIG. 1. The working procedure of the AMOLED pixel driving circuit according to the sequence is divided into three stages: a pre-charge stage 10, a threshold voltage programming stage 20 and a drive stage 30. In the pre-charge stage 10, the first scan control signal S10 provides high voltage level, and the second scan control signal S20 provides high voltage level, and the third thin film transistor T30 is activated, and the power source voltage VDD charges the second capacitor C20 to VDD through the third thin film transistor T30 and the second third thin film transistor T20, and then the voltage of the top gate of the first third thin film transistor T10 is VDD to drop the threshold voltage of the first third thin film transistor T10, and the third scan control signal S30 provides low voltage level to deactivate the fourth thin film transistor T40, and the data signal Data cannot enter. In the threshold voltage programming stage 20, the first scan control signal S10 still provides high voltage level, and the second thin film transistor T20 is kept to be activated, and the second scan control signal S20 provides low voltage level, and the third thin film transistor T30 is deactivated, the third scan control signal S30 provides high voltage level, and the fourth thin film transistor T40 is activated, and the data signal Data provides a lower preset voltage $V_{pre}$ entering the bottom gate of the first thin film transistor T10, and the first thin film transistor T10 is activated due to the low threshold voltage, and the voltage stored by the second capacitor C20 is released through first thin film transistor T10, the second thin film transistor T20 and the organic light emitting diode D10, and the threshold voltage of the first thin film transistor constantly increases until the first thin film transistor T10 is deactivated, and then, the threshold voltage is $Vth = V_{BG} - V_S = V_{pre} - V_{OLED}$, wherein $V_{BG}$ represents the bottom gate of the first thin film transistor T10, and $V_S$ represents the source voltage of the first thin film transistor T10, and $V_{pre}$ represents the data signal voltage at this stage, and $V_{OLED}$ represents the threshold voltage of the organic light emitting diode D10. In the drive stage 30, the first scan control signal S10 provides a low voltage level pulse signal, and the second thin film transistor T20 is deactivated, and both the second scan control signal S20 and the third scan control signal S30 provide high voltage level, and both the third thin film transistor T30 and the fourth thin film transistor T40 are activated, and the data signal Data is raised and enters the bottom gate of the first thin film transistor T10, and the first thin film transistor T10 is activated, and the organic light emitting diode D10 emits light.

After the threshold voltage programming stage 20, the threshold voltage of the first thin film transistor T10 is $Vth = V_{pre} - V_{OLED}$, and according the formula of the current flowing through the thin film transistor:

$$I = \beta(V_{BG} - Vth - V_S)^2$$
$$= \beta(V_{Data} - V_{pre} + V_{OLED} - V_{OLED})^2$$
$$= \beta(V_{Data} - V_{pre})^2$$

wherein $\beta$ is a constant coefficient related with the property of the thin film transistor.

The value I of the current flowing through the organic light emitting diode D10 is irrelevant with both the threshold voltage of the first thin film transistor T10 and the threshold voltage of the organic light emitting diode D10, and only is relevant with the voltage differences of the data signal Data in the drive stage 30 and the threshold voltage programming stage 20.

Such kind of AMOLED pixel driving circuit can compensate the threshold voltage of the drive thin film transistor and the threshold voltage of the organic light emitting diode but it requires adjusting the voltage value of the data signal of the input circuit for achievement, which makes the data signal more complicated and increase the stress influence to the drive thin film transistor.

SUMMARY OF THE INVENTION

An objective of the present invention is to provide an AMOLED pixel driving circuit, which can compensate the threshold voltage drift of the drive thin film transistor and the light emitting diode and also can simplify the inputted data signal to stable the light emitting brightness of the organic light emitting diode and promote the display quality.

Another objective of the present invention is to provide an AMOLED pixel driving method, which can compensate the threshold voltage drift of the drive thin film transistor and the light emitting diode and also can simplify the inputted data signal to stable the light emitting brightness of the organic light emitting diode and promote the display quality.

For realizing the aforesaid objectives, the present invention first provides an AMOLED pixel driving circuit, comprising: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;

the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;

a gate of the second thin film transistor receives a first scan control signal, and a source receives a data signal, and a drain is electrically coupled to the first node;

a gate of the third thin film transistor receives a second scan control signal, and a source receive a preset voltage, and a drain is electrically coupled to the first node;

a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;

one end of the first capacitor is electrically coupled to the first node, and the other end is grounded;

one end of the second capacitor is electrically coupled to the third node, and the other end is grounded;

the anode of the organic light emitting diode is electrically coupled to the source of the first thin film transistor, and a cathode is grounded.

All of the first scan control signal, the second scan control signal and the third scan control signal are provided by an external sequence controller.

All of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

The preset voltage is a constant voltage.

The first scan control signal, the second scan control signal and the third scan control signal are combined with one another, and correspond to a pre-charge stage, a threshold voltage programming stage and a drive stage one after another;

in the pre-charge stage, the first scan control signal provides high voltage level, and the second scan control signal provides high voltage level, and the third scan control signal provides high voltage level;

in the threshold voltage programming stage, the first scan control signal provides low voltage level, and the second scan control signal provides high voltage level, and the third scan control signal provides low voltage level;

in the drive stage, the first scan control signal provides a high voltage level pulse signal, and the second scan control signal provides low voltage level, and the third scan control signal provides high voltage level.

The present invention further provides an AMOLED pixel driving method, comprising steps of:

step 1, providing an AMOLED pixel driving circuit;

the AMOLED pixel driving circuit comprises: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;

the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;

a gate of the second thin film transistor receives a first scan control signal, and a source receives a data signal, and a drain is electrically coupled to the first node;

a gate of the third thin film transistor receives a second scan control signal, and a source receive a preset voltage, and a drain is electrically coupled to the first node;

a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;

one end of the first capacitor is electrically coupled to the first node, and the other end is grounded;

one end of the second capacitor is electrically coupled to the third node, and the other end is grounded;

the anode of the organic light emitting diode is electrically coupled to the source of the first thin film transistor, and a cathode is grounded;

step 2, entering a pre-charge stage;

the first scan control signal provides low voltage level, and the second thin film transistor is deactivated, and the second scan control signal provides high voltage level, and the third thin film transistor and the fifth thin film transistor are activated, the third scan control signal provides high voltage level, and the fourth thin film transistor is activated, and the first node and the bottom gate of the first thin film transistor are written with a preset voltage, and the first capacitor is charged to the preset voltage, and the second node, the third node and the top gate of the first thin film transistor are written with the power source voltage, and the second capacitor is charged to the power source voltage;

step 3, entering a threshold voltage programming stage;

the first scan control signal provides low voltage level, and the second thin film transistor is deactivated, and the second scan control signal provides high voltage level, and the third thin film transistor and the fifth thin film transistor are activated, the third scan control signal provides low voltage level, and the fourth thin film transistor is deactivated, and the first thin film transistor is activated, and the first node and the bottom gate of the first thin film transistor are kept at the preset voltage, and voltages of the second node, the third node and the top gate of the first thin film transistor drop, and the threshold voltage of the first thin film transistor constantly increases, and as the threshold voltage of the first thin film transistor reaches $Vth=V_{pre}-V_{OLED}$, the threshold voltage of the first thin film transistor stops changing to accomplish the threshold voltage programming;

step 4, entering a drive stage;

the first scan control signal provides a high voltage level pulse signal, and the second thin film transistor is activated, and the second scan control signal provides low voltage level, and the third thin film transistor and the fifth thin film transistor are deactivated, the third scan control signal provides high voltage level, and the fourth thin film transistor is activated, and the first node and the bottom gate of the first thin film transistor are written with a voltage value of the data signal, and the second node and the drain of the first thin film transistor are written with the power source voltage, and voltages of the third node and the top gate of the first thin film transistor are kept unchanged under a storage function of the second capacitor to keep the threshold voltage of the first thin film transistor to be $Vth=V_{pre}-V_{OLED}$, and the first thin film transistor is activated, and the organic light emitting diode emits light, and a current $I=\beta(V_{Data}-V_{pre})^2$ flowing through the organic light emitting diode, which is irrelevant with both the threshold voltage of the first thin film transistor and the threshold voltage of the organic light emitting diode.

All of the first scan control signal, the second scan control signal and the third scan control signal are provided by an external sequence controller.

All of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

The preset voltage is a constant voltage.

The present invention further provides an AMOLED pixel driving circuit, comprising: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;

the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;

a gate of the second thin film transistor receives a first scan control signal, and a source receives a data signal, and a drain is electrically coupled to the first node;

a gate of the third thin film transistor receives a second scan control signal, and a source receive a preset voltage, and a drain is electrically coupled to the first node;

a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;

one end of the first capacitor is electrically coupled to the first node, and the other end is grounded;

one end of the second capacitor is electrically coupled to the third node, and the other end is grounded;

the anode of the organic light emitting diode is electrically coupled to the source of the first thin film transistor, and a cathode is grounded;

wherein all of the first scan control signal, the second control signal and the third scan control signal are provided by an external sequence controller;

wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

The benefits of the present invention are: the present invention provides an AMOLED pixel driving circuit and a pixel driving method. By utilizing the dual gate thin film transistor to be the drive thin film transistor, in the pre-charge stage, the second, the third scan drive signals are employed to control the third, the fourth and the fifth thin film transistors to be activated to write the preset voltage to the bottom gate of the first thin film transistor, i.e. the drive thin film transistor, and to write the power source voltage to the top gate; in the threshold voltage programming stage, the third scan drive signal is employed to control the fourth thin film transistor to be deactivated to drop the voltage of the top gate of the first thin film transistor, and the threshold voltage is raised until the threshold voltage is lifted up to Vth=$V_{pre}$-$V_{OLED}$; in the drive stage, the voltage of the top gate of the first thin film transistor is kept unchanged to keep the threshold voltage remaining to be Vth=$V_{pre}$-$V_{OLED}$, and the data signal drives the first thin film transistor to be activated to make the organic light emitting diode emit light, and a current value flowing through the first thin film transistor and the organic light emitting diode is irrelevant with both the threshold voltage of the first thin film transistor and the threshold voltage of the organic light emitting diode to compensate the threshold voltage drifts of the drive thin film transistor and the organic light emitting diode, and to simplify the inputted data signal for ensuring that the current flowing through the organic light emitting diode is a constant value to stable the light emitting brightness of the organic light emitting diode and promote the display quality.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
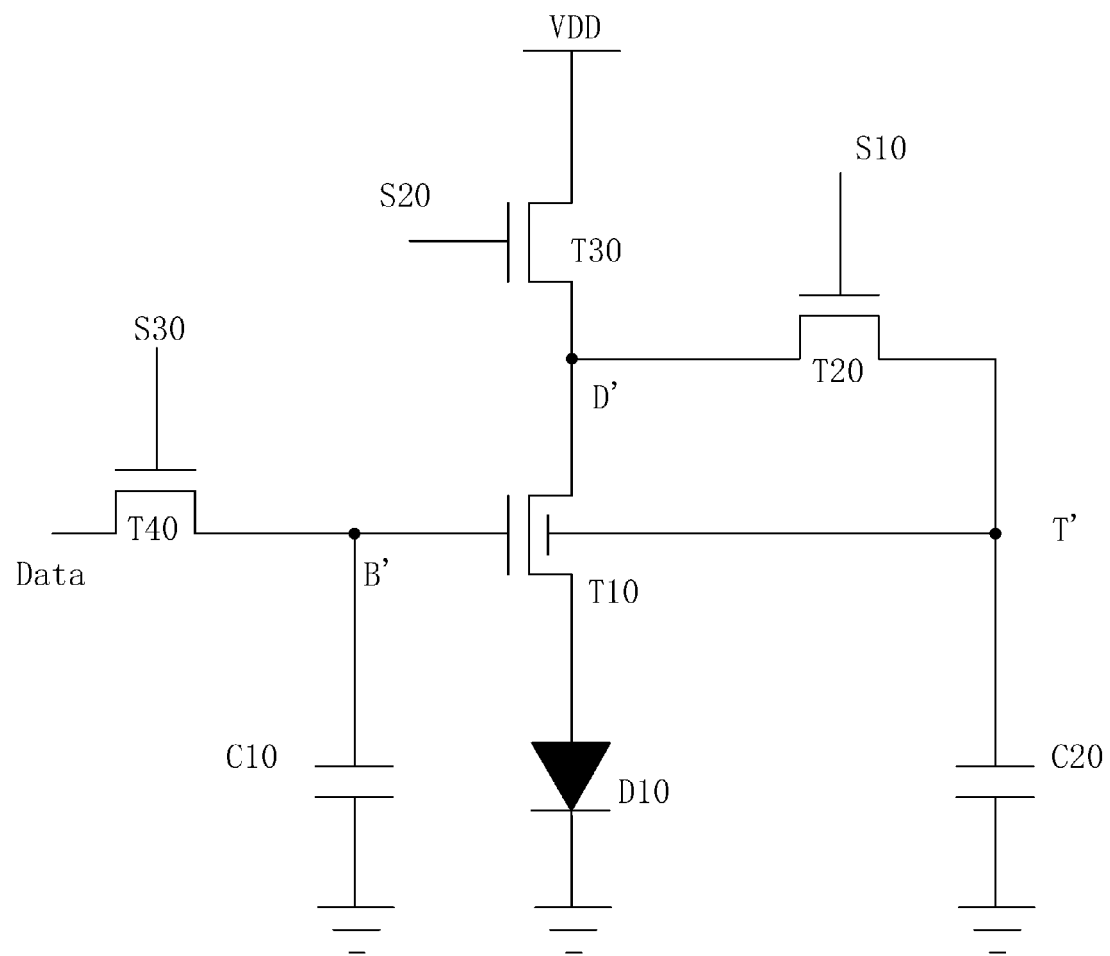
FIG. 1 is a circuit diagram of an AMOLED pixel driving circuit according to prior art.
Figure 2:
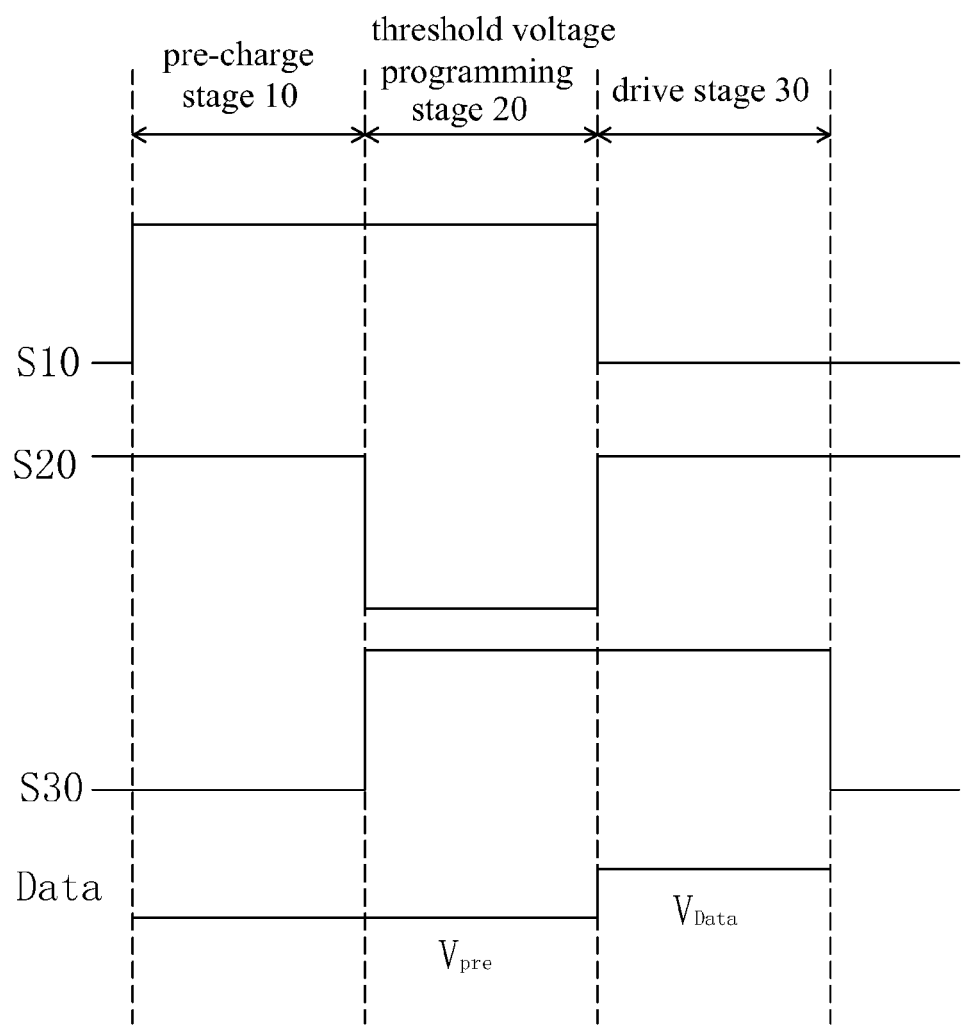
FIG. 2 is a sequence diagram of an AMOLED pixel driving circuit shown in FIG. 1.
Figure 3:
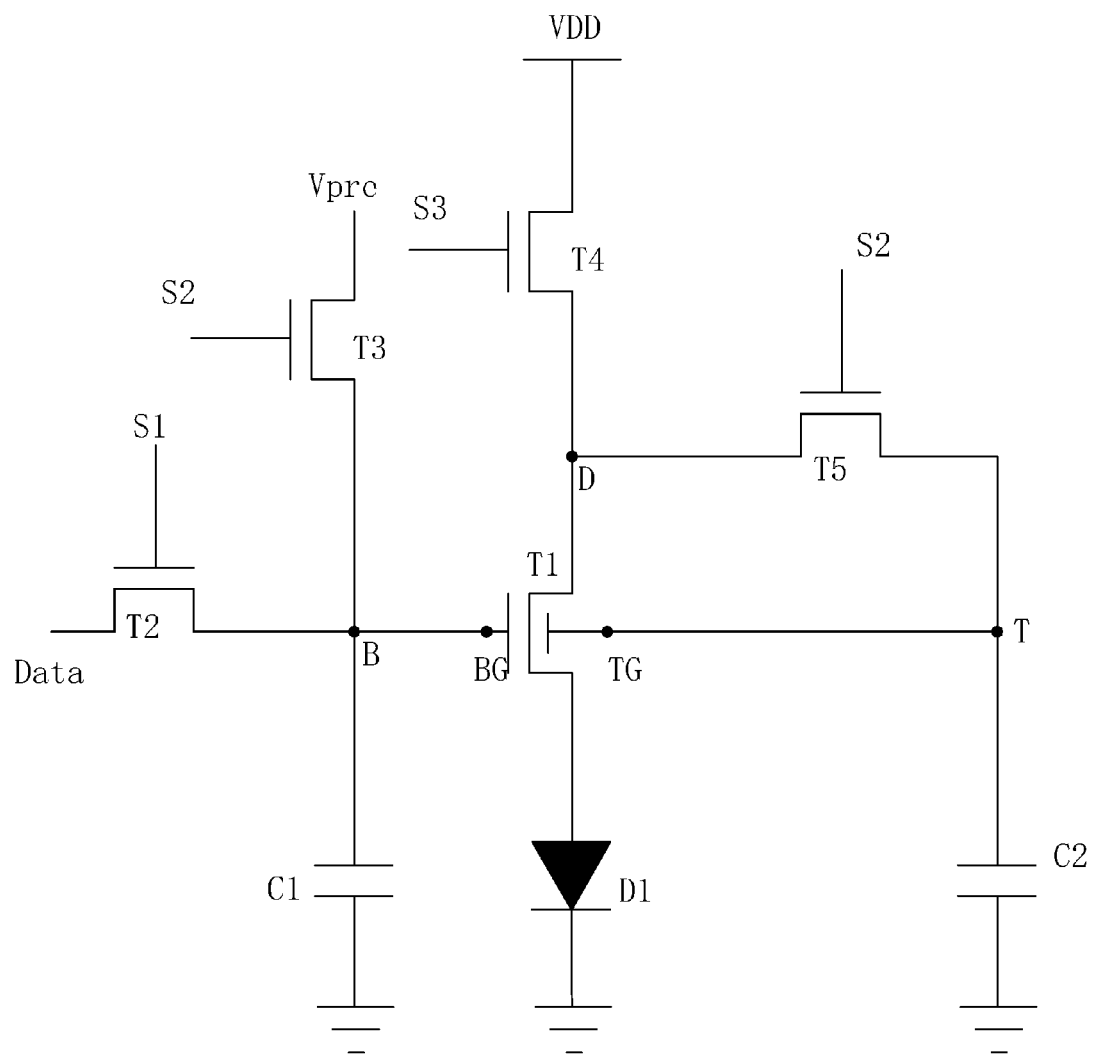
FIG. 3 is a circuit diagram of an AMOLED pixel driving circuit according to present invention.
Figure 4:
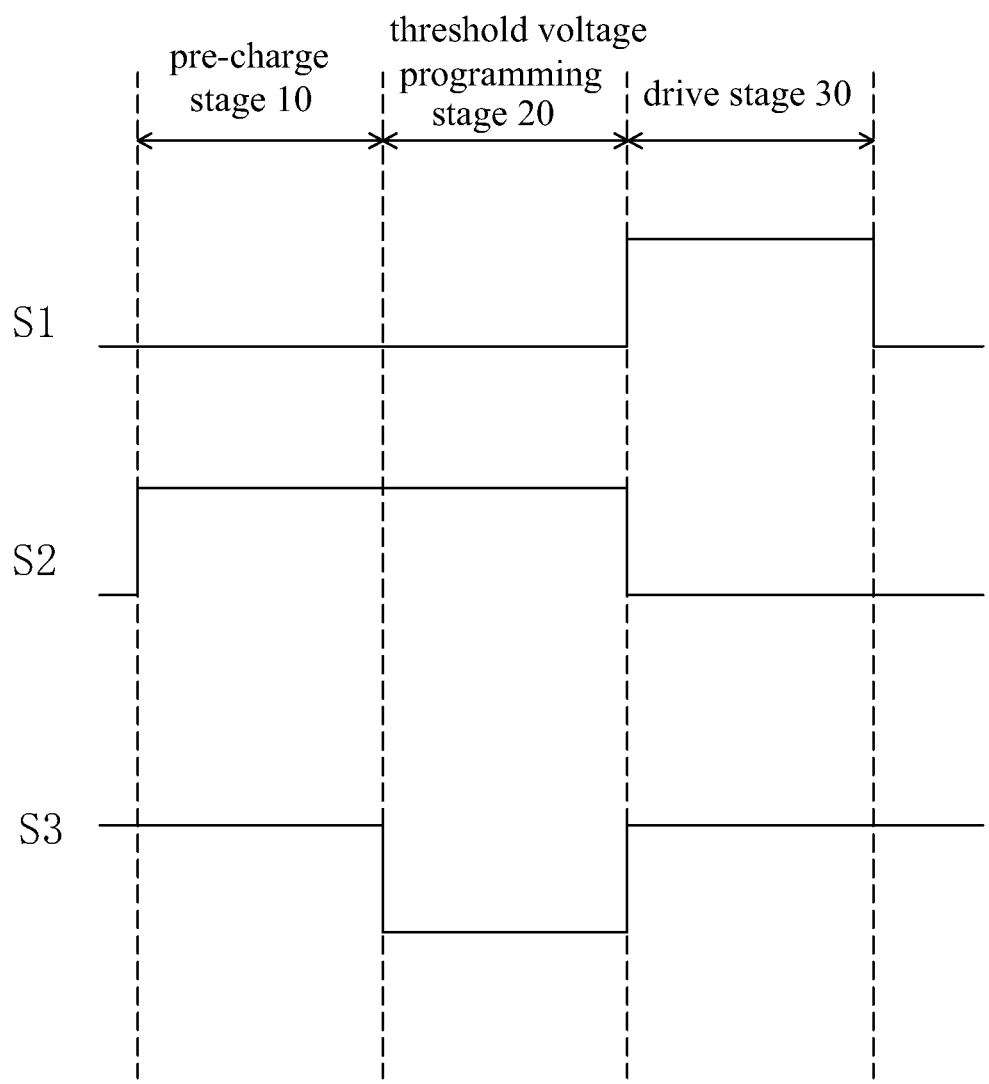
FIG. 4 is a sequence diagram of the AMOLED pixel driving circuit shown in FIG. 3.

Please refer to FIG. 3 and FIG. 4, together. The present invention first provides an AMOLED pixel driving circuit, and the AMOLED pixel driving circuit utilizes a 5T2C structure, and comprises: a first thin film transistor T1, a second thin film transistor T2, a third thin film transistor T3, a fourth thin film transistor T4, a fifth thin film transistor T5, a first capacitor C1, a second capacitor C2 and an organic light emitting diode D1, wherein the first thin film transistor is employed to be a drive thin film transistor, and the second thin film transistor T1 is employed to be a switch thin film transistor T2.

Significantly, the first thin film transistor T1 is a dual gate thin film transistor, in which the stress influence of the voltage and light irradiation to the threshold voltage is smaller, and meanwhile, the threshold voltage Vth is not a fixed value but has negative correlation with the received top gate voltage. Namely, the larger the received top gate voltage is, the smaller the threshold voltage is.

As shown in FIG. 3, the specific connection of the AMOLED pixel driving circuit is:

a bottom gate BG of the first thin film transistor T1 is electrically coupled to a first node B, and a top gate TG is electrically coupled to a third node T, and a drain is electrically coupled to a second node D, and a source is electrically coupled to an anode of the organic light emitting diode D1; a gate of the second thin film transistor T2 receives a first scan control signal S1, and a source receives a data signal Data, and a drain is electrically coupled to the first node B; a gate of the third thin film transistor T3 receives a second scan control signal S2, and a source receive a preset voltage $V_{pre}$, and a drain is electrically coupled to the first node B; a gate of the fourth thin film transistor T4 receives a third scan control signal S3, and a source receives a power source voltage VDD, and a drain is electrically coupled to the second node D; a gate of the fifth thin film transistor T5 receives a second scan control signal S2, and a source is electrically coupled to the third node T, and a drain is electrically coupled to the second node D; one end of the first capacitor C1 is electrically coupled to the first node B, and the other end is grounded; one end of the second capacitor C2 is electrically coupled to the third node T, and the other end is grounded; the anode of the organic light emitting diode D1 is electrically coupled to the source of the first thin film transistor T1, and a cathode is grounded.

all of the first thin film transistor T1, the second thin film transistor T2, the third thin film transistor T3, the fourth thin film transistor T4 and the fifth thin film transistor T5 are Low Temperature Poly-silicon thin film transistors, oxide semiconductor thin film transistors or amorphous silicon thin film transistors. The preset voltage $V_{pre}$ is a constant voltage.

All of the first scan control signal S1, the second scan control signal S2 and the third scan control signal S3 are provided by an external sequence controller. As shown in FIG. 4, the first scan control signal S1, the second scan control signal S2 and the third scan control signal S3 are combined with one another, and correspond to a pre-charge stage 1, a threshold voltage programming stage 2 and a drive stage 3 one after another. In the pre-charge stage 1, the first scan control signal S1 provides high voltage level, and the second scan control signal S2 provides high voltage level, and the third scan control signal S3 provides high voltage level; in the threshold voltage programming stage 2, the first scan control signal S1 provides low voltage level, and the second scan control signal S2 provides high voltage level, and the third scan control signal S3 provides low voltage level; in the drive stage 3, the first scan control signal S1 provides a high voltage level pulse signal, and the second scan control signal S2 provides low voltage level, and the third scan control signal S3 provides high voltage level.

Figure 5:
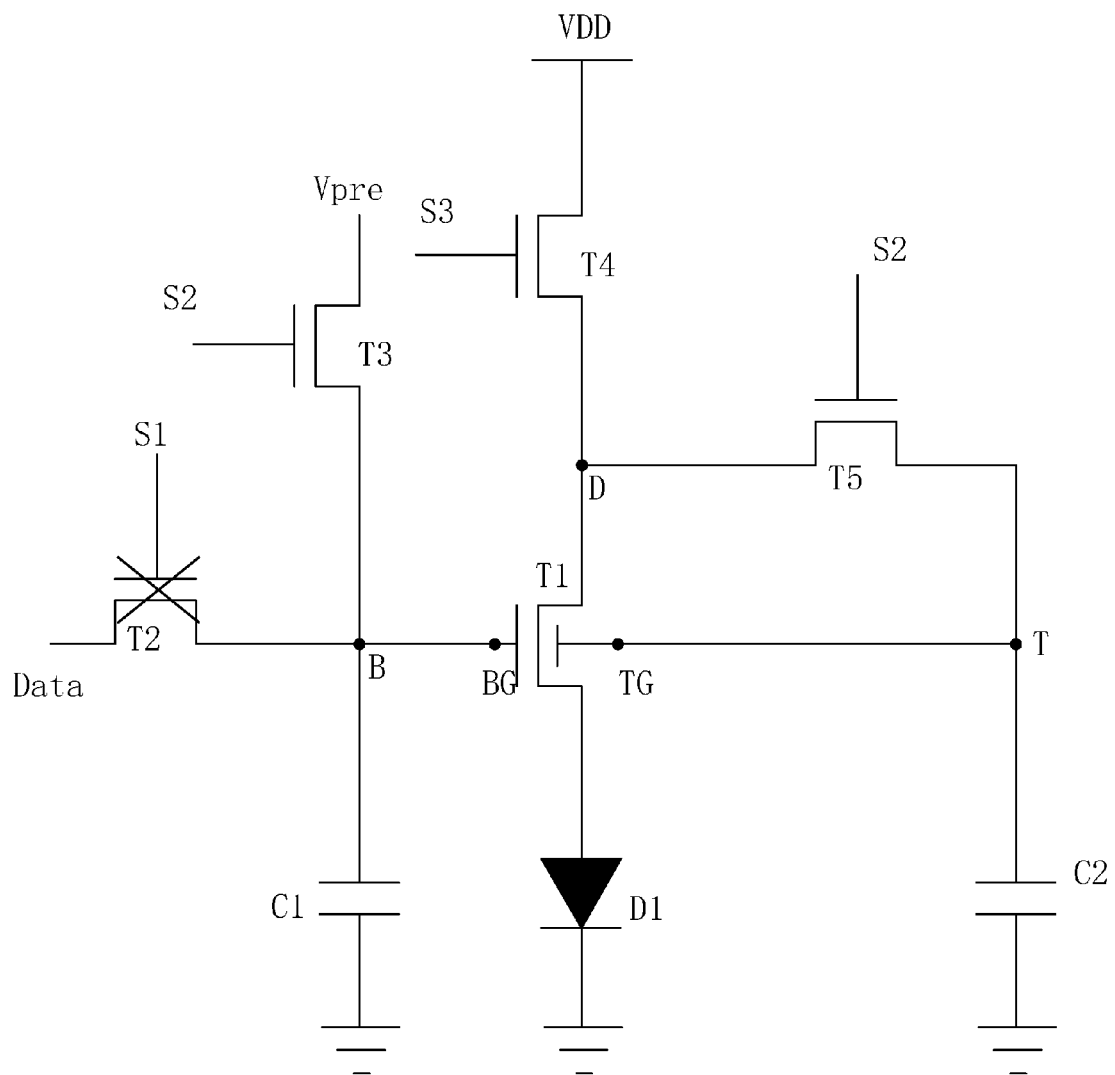
FIG. 5 is a diagram of the step 2 of an AMOLED pixel driving method according to the present invention.
Figure 6:
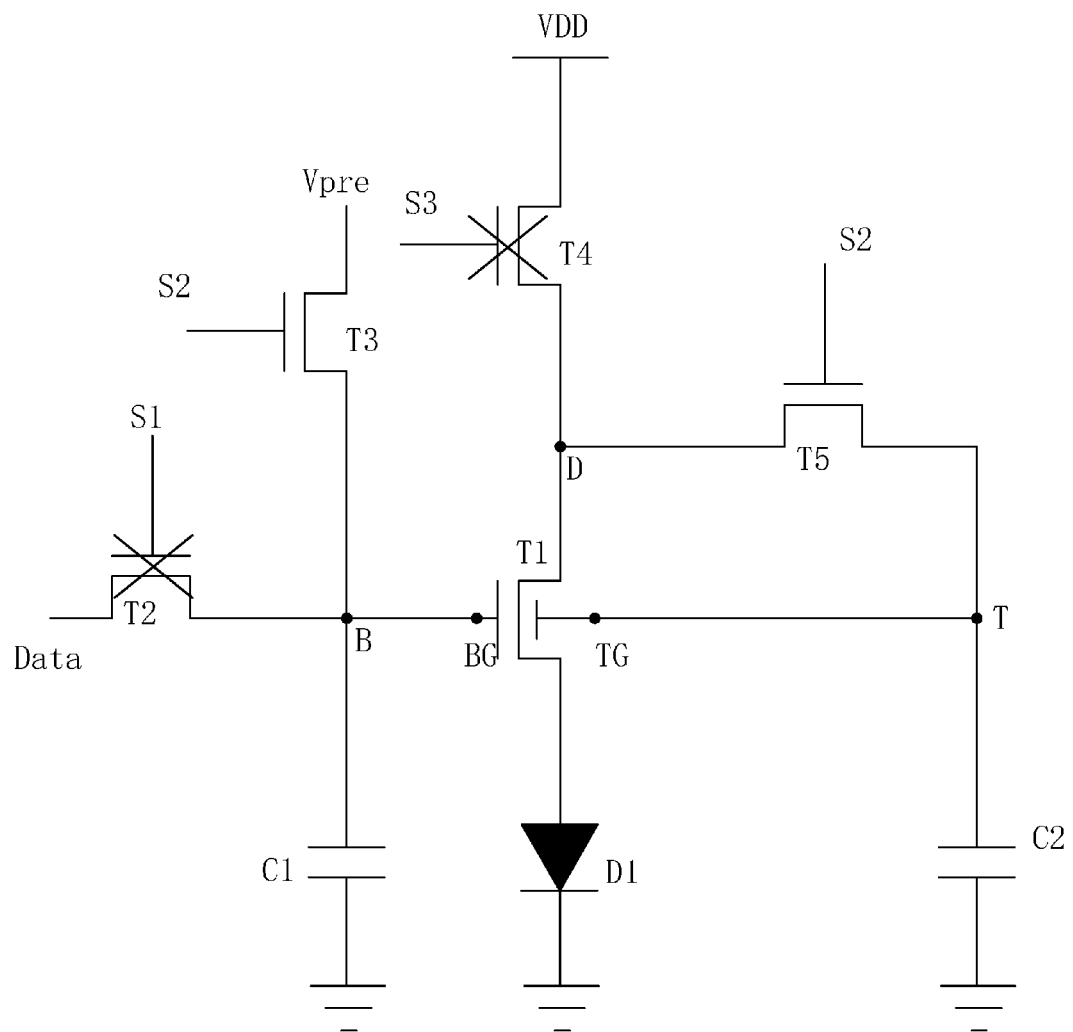
FIG. 6 is a diagram of the step 3 of an AMOLED pixel driving method according to the present invention.
Figure 7:
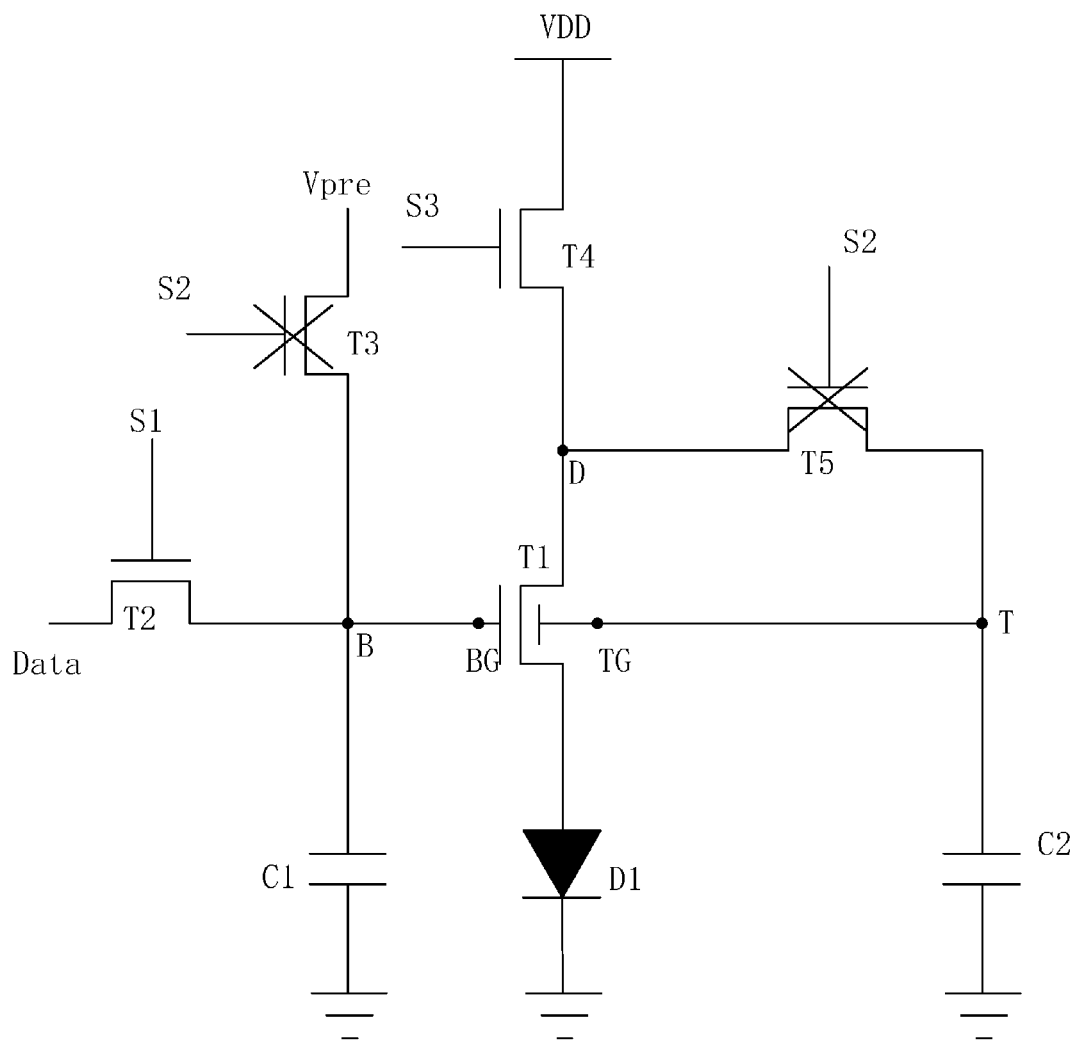
FIG. 7 is a diagram of the step 4 of an AMOLED pixel driving method according to the present invention.

With combination of FIG. 5 to FIG. 7, in the pre-charge stage, the second, the third scan drive signals S2, S3 provide high voltage levels to activate the third, the fourth and the fifth thin film transistors T3, T4, T5, and the bottom gate BG of the thin film transistor T1 is written with the preset voltage $V_{pre}$ through the activated third thin film transistor T3, and meanwhile, the first capacitor C1 is charged to the preset voltage $V_{pre}$, and the top gate TG is written with the power source voltage VDD through the activated fourth, fifth thin film transistors T4, T5, and meanwhile, the second capacitor C2 is charged to the power source voltage VDD, and due to the dual gate property of the first thin film transistor T1, under circumstance that the voltage of the top gate TG is the power source voltage VDD which is a high voltage, the threshold voltage Vth is very small; in the threshold voltage programming stage, the second drive signal S2 is kept at high voltage level, and the third and the fifth thin film transistors T3, T5 are kept to be activated, and the third scan drive signal S3 provides low voltage level to deactivate the fourth thin film transistor T4, and the first thin film transistor T1 is activated, and the bottom gate BG of the first thin film transistor T1 is kept at the preset voltage $V_{pre}$, and the voltage of the top gate TG of the first thin film transistors T1 drops, and according to the dual gate property of the first thin film transistor T1, the threshold voltage constantly increases, and as the threshold voltage reaches $Vth=V_{BG}-V_S$, i.e. $Vth=V_{pre}-V_{OLED}$, wherein Vth represents the threshold voltage of the first thin film transistor T1, and the $V_{BG}$ represents the voltage of the bottom gate BG of the first thin film transistor T1, and $V_S$ represents the voltage of the source of the first thin film transistor T1, and $V_{OLED}$ represents the threshold voltage of the organic light emitting diode D1, and the voltage of the top gate TG of the first thin film transistor T1 stops dropping to accomplish the threshold voltage programming; in the drive stage, the first scan drive signal S1 controls the second thin film transistor T2, and the third scan drive signal S3 controls the fourth thin film transistor T4 to be activated, and the data signal Data is transmitted to the bottom gate BG of the first thin film transistor T1 through the second thin film transistor T2, and the drain of the first thin film transistor T1 is written with the power source voltage VDD, and the top gate TG of the first thin film transistor T1 is kept unchanged under the storage function of the second capacitor C2 to keep the threshold voltage of the first thin film transistor T1 remain to be $Vth=V_{pre}-V_{OLED}$, and the first thin film transistor T1 is activated, and the organic light emitting diode D1 emits light.

According the formula of the current flowing through the organic light emitting diode OLED:

$$I = \beta(V_{BG} - Vth - V_S)^2$$
$$= \beta(V_{Data} - V_{pre} + V_{OLED} - V_{OLED})^2$$
$$= \beta(V_{Data} - V_{pre})^2$$

wherein $V_{Data}$ represents the voltage of the data signal Data, and β is a constant coefficient related with the property of the thin film transistor.

Accordingly, a current value flowing through the first thin film transistor T1 and the organic light emitting diode D1 is irrelevant with both the threshold voltage Vth of the first thin film transistor T1 and the threshold voltage $V_{OLED}$ of the organic light emitting diode D1 to compensate the threshold voltage drifts of the drive thin film transistor and the organic light emitting diode. Meanwhile, the preset voltage $V_{pre}$ is a constant voltage, and the current flowing through the organic light emitting diode D1 can be ensured to be a constant value without changing the voltage of the data signal Data to stable the light emitting brightness of the organic light emitting diode and promote the display quality. The inputted data signal is simplified in comparison with prior art, and the stress influence of the data signal to the drive thin film transistor will not be increased.

Please refer from FIG. 3 to FIG. 7. The present invention further provides an AMOLED pixel driving method, comprising steps of:

step 1, providing an AMOLED pixel driving circuit utilizing the 5T2C structure as shown in the aforesaid FIG. 3, and the description of the AMOLED pixel driving circuit is not repeated here.

Significantly, the first thin film transistor T1 is a dual gate thin film transistor, in which the stress influence of the voltage and light irradiation to the threshold voltage is smaller, and meanwhile, the threshold voltage Vth is not a fixed value but has negative correlation with the received top gate voltage. Namely, the larger the received top gate voltage is, the smaller the threshold voltage is.

Specifically, all of the first thin film transistor T1, the second thin film transistor T2, the third thin film transistor T3, the fourth thin film transistor T4 and the fifth thin film transistor T5 are Low Temperature Poly-silicon thin film transistors, oxide semiconductor thin film transistors or amorphous silicon thin film transistors. The preset voltage $V_{pre}$ is a constant voltage. All of the first scan control signal S1, the second scan control signal S2 and the third scan control signal S3 are provided by an external sequence controller.

step 2, referring to FIG. 4 and FIG. 5 together, entering a pre-charge stage 1.

The first scan control signal S1 provides low voltage level, and the second thin film transistor T2 is deactivated, and the second scan control signals S2 provides high voltage level, and the third thin film transistor T3 and the fifth thin film transistors T5 are activated, and the third scan control signal S3 provides high voltage level, and the fourth thin film transistor T4 is activated, and the first node B and the bottom gate BG of the first thin film transistor T1 are written with a preset voltage $V_{pre}$, and the first capacitor C1 is charged to the preset voltage $V_{pre}$, and the second node D, the third node T and the top gate TG of the first thin film transistor T1 are written with the power source voltage VDD, and the second capacitor C2 is charged to the power source voltage VDD. In the pre-charge stage, the voltage of the top gate TG of the first thin film transistor T1 is the power source voltage VDD, and the voltage of the bottom gate BG is the preset voltage $V_{pre}$, and due to the dual gate property, under circumstance that the voltage of the top gate TG of the thin film transistor T1 is the power source voltage VDD which is a high voltage, the threshold voltage Vth is very small.

step 3, referring to FIG. 4 and FIG. 6 together, entering a threshold voltage programming stage 2.

The first scan control signal S1 provides low voltage level, and the second thin film transistor T2 is deactivated, and the second scan control signal S2 provides high voltage level, and the third thin film transistor T3 and the fifth thin film transistor T5 are activated, the third scan control signal S3 provides low voltage level, and the fourth thin film transistor T4 is deactivated, and the first thin film transistor T1 is activated, and the first node B and the bottom gate BG of the first thin film transistor T1 are kept at the preset voltage $V_{pre}$, and voltages of the second node D, the third node T and the top gate TG of the first thin film transistor T1 drop, and the threshold voltage of the first thin film transistor T1 constantly increases, and as the threshold voltage of the first thin film transistor T1 reaches Vth=$V_{BG}$-$V_S$, i.e. Vth=$V_{pre}$-$V_{OLED}$, wherein Vth represents the threshold voltage of the first thin film transistor T1, and the $V_{BG}$ represents the voltage of the bottom gate BG of the first thin film transistor T1, and $V_S$ represents the voltage of the source of the first thin film transistor T1, and $V_{OLED}$ represents the threshold voltage of the organic light emitting diode D1, and the threshold voltage of the first thin film transistor T1 stops changing to accomplish the threshold voltage programming.

step 4, referring to FIG. 4 and FIG. 7 together, entering a drive stage 3.

The first scan control signal S1 provides a high voltage level pulse signal, and the second thin film transistor T2 is activated, and the second scan control signal S2 provides low voltage level, and the third thin film transistor T3 and the fifth thin film transistor T5 are deactivated, the third scan control signal S3 provides high voltage level, and the fourth thin film transistor T4 is activated, and the first node B and the bottom gate BG of the first thin film transistor T1 are written with a voltage value of the data signal Data, and the second node D and the drain of the first thin film transistor T1 are written with the power source voltage VDD, and voltages of the third node T and the top gate TG of the first thin film transistor T1 are kept unchanged under a storage function of the second capacitor C2 to keep the threshold voltage of the first thin film transistor T1 remaining to be Vth=$V_{pre}$-$V_{OLED}$, and the first thin film transistor T1 is activated, and the organic light emitting diode D1 emits light.

According the formula of the current flowing through the organic light emitting diode OLED:

$$I = \beta(V_{BG} - Vth - V_S)^2$$
$$= \beta(V_{Data} - V_{pre} + V_{OLED} - V_{OLED})^2$$
$$= \beta(V_{Data} - V_{pre})^2$$

wherein $V_{Data}$ represents the voltage of the data signal Data, and β is a constant coefficient related with the property of the thin film transistor.

Accordingly, a current value flowing through the first thin film transistor T1 and the organic light emitting diode D1 is irrelevant with both the threshold voltage Vth of the first thin film transistor T1 and the threshold voltage $V_{OLED}$ of the organic light emitting diode D1 to compensate the threshold voltage drifts of the drive thin film transistor and the organic light emitting diode. Meanwhile, the preset voltage $V_{pre}$ is a constant voltage, and the current flowing through the organic light emitting diode D1 can be ensured to be a constant value without changing the voltage of the data signal Data to stable the light emitting brightness of the organic light emitting diode and promote the display quality. The inputted data signal is simplified in comparison with prior art, and the stress influence of the data signal to the drive thin film transistor will not be increased.

In conclusion, in the AMOLED pixel driving circuit and a pixel driving method according to the present invention, by utilizing the dual gate thin film transistor to be the drive thin film transistor, in the pre-charge stage, the second, the third scan drive signals are employed to control the third, the fourth and the fifth thin film transistors to be activated to write the preset voltage to the bottom gate of the first thin film transistor, i.e. the drive thin film transistor, and to write the power source voltage to the top gate; in the threshold voltage programming stage, the third scan drive signal is employed to control the fourth thin film transistor to be deactivated to drop the voltage of the top gate of the first thin film transistor, and the threshold voltage is raised until the threshold voltage is lifted up to Vth=$V_{pre}$-$V_{OLED}$; in the drive stage, the voltage of the top gate of the first thin film transistor is kept unchanged to keep the threshold voltage remaining to be Vth=$V_{pre}$-$V_{OLED}$, and the data signal drives the first thin film transistor to be activated to make the organic light emitting diode emit light, and a current value flowing through the first thin film transistor and the organic light emitting diode is irrelevant with both the threshold voltage of the first thin film transistor and the threshold voltage of the organic light emitting diode to compensate the threshold voltage drifts of the drive thin film transistor and the organic light emitting diode, and to simplify the inputted data signal for ensuring that the current flowing through the organic light emitting diode is a constant value to stable the light emitting brightness of the organic light emitting diode and promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An AMOLED pixel driving circuit, comprising: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;

the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;

a gate of the second thin film transistor receives a first scan control signal, and a source receives a data signal, and a drain is electrically coupled to the first node;

a gate of the third thin film transistor receives a second scan control signal, and a source receive a preset voltage, and a drain is electrically coupled to the first node;

a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;

one end of the first capacitor is electrically coupled to the first node, and the other end is grounded;

one end of the second capacitor is electrically coupled to the third node, and the other end is grounded;

the anode of the organic light emitting diode is electrically coupled to the source of the first thin film transistor, and a cathode is grounded.

2. The AMOLED pixel driving circuit according to claim 1, wherein all of the first scan control signal, the second scan control signal and the third scan control signal are provided by an external sequence controller.

3. The AMOLED pixel driving circuit according to claim 1, wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

4. The AMOLED pixel driving circuit according to claim 1, wherein the preset voltage is a constant voltage.

5. The AMOLED pixel driving circuit according to claim 1, wherein the first scan control signal, the second scan control signal and the third scan control signal are combined with one another, and correspond to a pre-charge stage, a threshold voltage programming stage and a drive stage one after another;
in the pre-charge stage, the first scan control signal provides high voltage level, and the second scan control signal provides high voltage level, and the third scan control signal provides high voltage level;
in the threshold voltage programming stage, the first scan control signal provides low voltage level, and the second scan control signal provides high voltage level, and the third scan control signal provides low voltage level;
in the drive stage, the first scan control signal provides a high voltage level pulse signal, and the second scan control signal provides low voltage level, and the third scan control signal provides high voltage level.

6. An AMOLED pixel driving method, comprising steps of:
step 1, providing an AMOLED pixel driving circuit;
the AMOLED pixel driving circuit comprises: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;
the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;
a gate of the second thin film transistor receives a first scan control signal, and a source receives a data signal, and a drain is electrically coupled to the first node;
a gate of the third thin film transistor receives a second scan control signal, and a source receive a preset voltage, and a drain is electrically coupled to the first node;
a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;
one end of the first capacitor is electrically coupled to the first node, and the other end is grounded;
one end of the second capacitor is electrically coupled to the third node, and the other end is grounded;
the anode of the organic light emitting diode is electrically coupled to the source of the first thin film transistor, and a cathode is grounded;
step 2, entering a pre-charge stage;
the first scan control signal provides low voltage level, and the second thin film transistor is deactivated, and the second scan control signal provides high voltage level, and the third thin film transistor and the fifth thin film transistor are activated, the third scan control signal provides high voltage level, and the fourth thin film transistor is activated, and the first node and the bottom gate of the first thin film transistor are written with a preset voltage, and the first capacitor is charged to the preset voltage, and the second node, the third node and the top gate of the first thin film transistor are written with the power source voltage, and the second capacitor is charged to the power source voltage;
step 3, entering a threshold voltage programming stage;
the first scan control signal provides low voltage level, and the second thin film transistor is deactivated, and the second scan control signal provides high voltage level, and the third thin film transistor and the fifth thin film transistor are activated, the third scan control signal provides low voltage level, and the fourth thin film transistor is deactivated, and the first thin film transistor is activated, and the first node and the bottom gate of the first thin film transistor are kept at the preset voltage, and voltages of the second node, the third node and the top gate of the first thin film transistor drop, and the threshold voltage of the first thin film transistor constantly increases, and as the threshold voltage of the first thin film transistor reaches $Vth=V_{pre}-V_{OLED}$, the threshold voltage of the first thin film transistor stops changing to accomplish the threshold voltage programming;
step 4, entering a drive stage;
the first scan control signal provides a high voltage level pulse signal, and the second thin film transistor is activated, and the second scan control signal provides low voltage level, and the third thin film transistor and the fifth thin film transistor are deactivated, the third scan control signal provides high voltage level, and the fourth thin film transistor is activated, and the first node and the bottom gate of the first thin film transistor are written with a voltage value of the data signal, and the second node and the drain of the first thin film transistor are written with the power source voltage, and voltages of the third node and the top gate of the first thin film transistor are kept unchanged under a storage function of the second capacitor to keep the threshold voltage of the first thin film transistor to be $Vth=V_{pre}-V_{OLED}$, and the first thin film transistor is activated, and the organic light emitting diode emits light, and a current $I=\beta(V_{Data}-V_{pre})^2$ flowing through the organic light emitting diode, which is irrelevant with both the threshold voltage of the first thin film transistor and the threshold voltage of the organic light emitting diode.

7. The AMOLED pixel driving method according to claim 6, wherein all of the first scan control signal, the second scan control signal and the third scan control signal are provided by an external sequence controller.

8. The AMOLED pixel driving method according to claim 6, wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

9. The AMOLED pixel driving method according to claim 6, wherein the preset voltage is a constant voltage.

10. An AMOLED pixel driving circuit, comprising: a first thin film transistor, a second thin film transistor, a third thin film transistor, a fourth thin film transistor, a fifth thin film transistor, a first capacitor, a second capacitor and an organic light emitting diode; the first thin film transistor is a drive thin film transistor, and the first thin film transistor is employed to be a drive thin film transistor, and the second thin film transistor is employed to be a switch thin film transistor;

the first thin film transistor is a dual gate thin film transistor, and a bottom gate thereof is electrically coupled to a first node, and a top gate is electrically coupled to a third node, and a drain is electrically coupled to a second node, and a source is electrically coupled to an anode of the organic light emitting diode;

a gate of the second thin film transistor receives a first scan control signal, and a source receives a data signal, and a drain is electrically coupled to the first node;

a gate of the third thin film transistor receives a second scan control signal, and a source receive a preset voltage, and a drain is electrically coupled to the first node;

a gate of the fourth thin film transistor receives a third scan control signal, and a source receives a power source voltage, and a drain is electrically coupled to the second node;

a gate of the fifth thin film transistor receives a second scan control signal, and a source is electrically coupled to the third node, and a drain is electrically coupled to the second node;

one end of the first capacitor is electrically coupled to the first node, and the other end is grounded;

one end of the second capacitor is electrically coupled to the third node, and the other end is grounded;

the anode of the organic light emitting diode is electrically coupled to the source of the first thin film transistor, and a cathode is grounded;

wherein all of the first scan control signal, the second scan control signal and the third scan control signal are provided by an external sequence controller;

wherein all of the first thin film transistor, the second thin film transistor, the third thin film transistor, the fourth thin film transistor and the fifth thin film transistor are Low Temperature Poly-silicon thin film transistors, oxide semiconductor thin film transistors or amorphous silicon thin film transistors.

11. The AMOLED pixel driving circuit according to claim 10, wherein the preset voltage is a constant voltage.

12. The AMOLED pixel driving circuit according to claim 10, wherein the first scan control signal, the second scan control signal and the third scan control signal are combined with one another, and correspond to a pre-charge stage, a threshold voltage programming stage and a drive stage one after another;

in the pre-charge stage, the first scan control signal provides high voltage level, and the second scan control signal provides high voltage level, and the third scan control signal provides high voltage level;

in the threshold voltage programming stage, the first scan control signal provides low voltage level, and the second scan control signal provides high voltage level, and the third scan control signal provides low voltage level;

in the drive stage, the first scan control signal provides a high voltage level pulse signal, and the second scan control signal provides low voltage level, and the third scan control signal provides high voltage level.

\* \* \* \* \*